(12) United States Patent
Mori

(10) Patent No.: US 8,871,615 B2
(45) Date of Patent: Oct. 28, 2014

(54) METHOD OF MANUFACTURING SEMICONDUCTOR DEVICE

(71) Applicant: Kabushiki Kaisha Toshiba, Tokyo (JP)

(72) Inventor: Shinji Mori, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/021,324

(22) Filed: Sep. 9, 2013

(65) Prior Publication Data

US 2014/0287569 A1    Sep. 25, 2014

(30) Foreign Application Priority Data

Mar. 25, 2013 (JP) ................................. 2013-061842

(51) Int. Cl.
| H01L 21/36 | (2006.01) |
|---|---|
| H01L 21/20 | (2006.01) |
| H01L 21/306 | (2006.01) |
| H01L 21/02 | (2006.01) |

(52) U.S. Cl.
CPC .... *H01L 21/02532* (2013.01); *H01L 21/30604* (2013.01); *Y10S 438/933* (2013.01)
USPC ........... 438/479; 438/176; 438/700; 438/738; 438/770; 438/933; 257/192; 257/507; 257/E21.09; 257/E21.019; 257/E29.084

(58) Field of Classification Search
None
See application file for complete search history.

(56) References Cited

U.S. PATENT DOCUMENTS

| 7,993,949 B2 * | 8/2011 | Perruchot et al. ............... 438/50 |
| 8,048,723 B2 * | 11/2011 | Chang et al. ................... 438/135 |
| 2005/0285097 A1 | 12/2005 | Shang et al. |
| 2009/0170295 A1 | 7/2009 | Vincent et al. |
| 2010/0044836 A1 | 2/2010 | Damlencourt et al. |
| 2010/0068869 A1 | 3/2010 | Vincent et al. |

FOREIGN PATENT DOCUMENTS

| JP | 2004-055943 | 2/2004 |
| JP | 2007-180285 | 7/2005 |
| JP | 2005-353701 | 12/2005 |
| JP | 2009-188388 | 8/2009 |
| JP | 2010-050459 | 3/2010 |

OTHER PUBLICATIONS

Vincent Benjamin, et al., "Method for Manufacturing Microelectronic Device Equipped with Semiconductor Area on Insulator with Horizontal Ge Concentration Gradient", English-language Abstract of JP 2010-074166, (Apr. 2, 2010).

(Continued)

*Primary Examiner* — Zandra Smith
*Assistant Examiner* — Khanh Duong
(74) *Attorney, Agent, or Firm* — Finnegan, Henderson, Farabow, Garrett & Dunner, LLP

(57) ABSTRACT

According to one embodiment, a method includes forming a first SiGe layer having a first profile of a concentration of Ge on a semiconductor substrate, forming a second SiGe layer having a second profile of a concentration of Ge on the first SiGe layer, the second profile lower than a first peak of the first profile, forming a mask layer on the second SiGe layer, etching the first and second SiGe layers by anisotropic etching using the mask layer as a mask to form trenches, selectively removing the first SiGe layer exposed into the trenches to form a cavity under the second SiGe layer, and oxidizing side and lower surfaces of the second SiGe layer exposed in the trenches and the cavity to increase the concentration of Ge in the second SiGe layer.

16 Claims, 12 Drawing Sheets

(56) References Cited

OTHER PUBLICATIONS

Shang, et al., "Integration of strained Ge into advance CMOS technology", English-language Abstract of JP 2008-504678, (Feb. 14, 2008).

Tsutomu Tezuka, et al., "High-performance Strained Si-on-Insulator MOSFETs by Novel Fabrication Processes Utilizing Ge-Condensation Technique", 2002 Symposium on VLSI Technology Digest of Technical Papers (2002), 2 pages.

S. Takagi, et al., "III-V/Ge CMOS technologies on Si platform", 2010 Symposium on VSLI Technology Digest of Technical Papers (2010), pp. 147-148.

\* cited by examiner

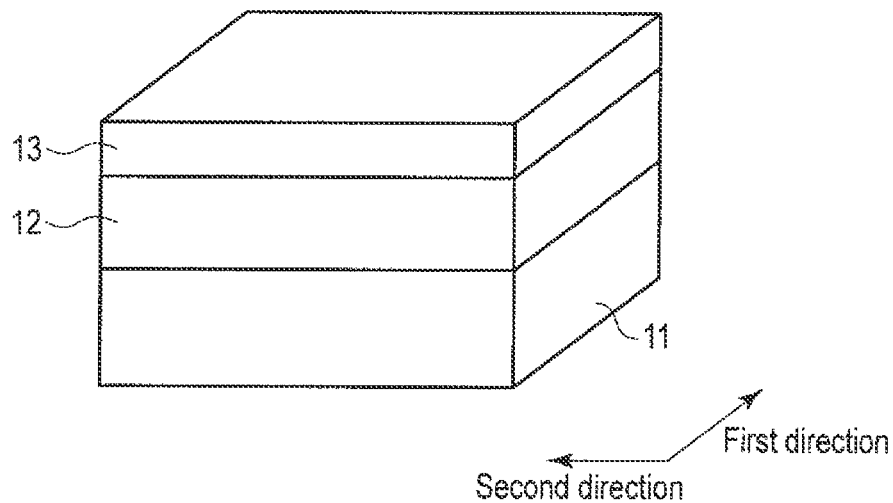
F I G. 1
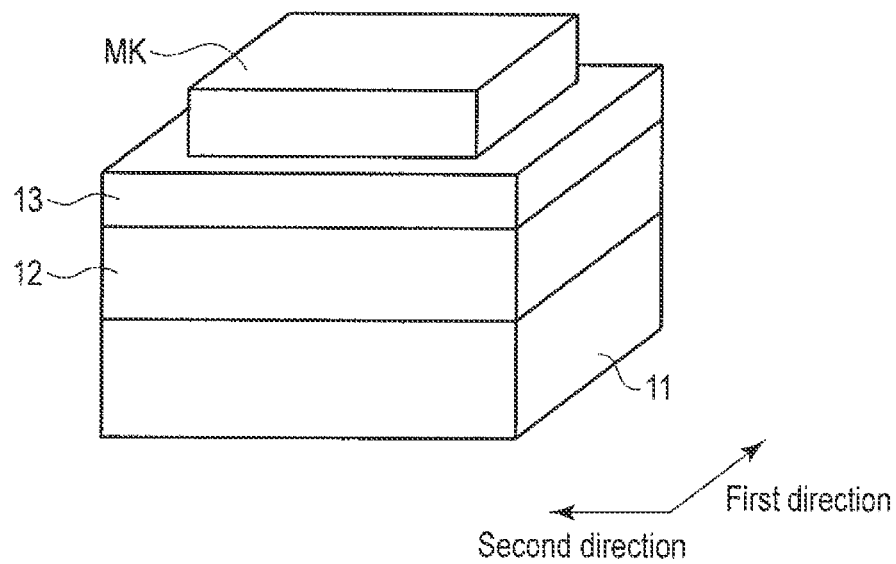
F I G. 2

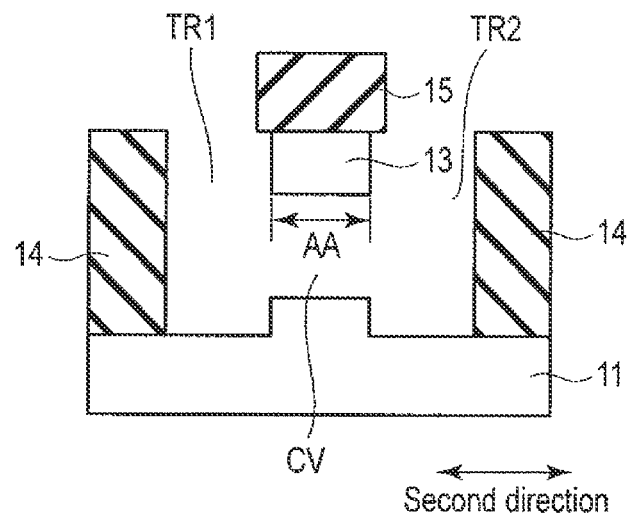
F I G. 11
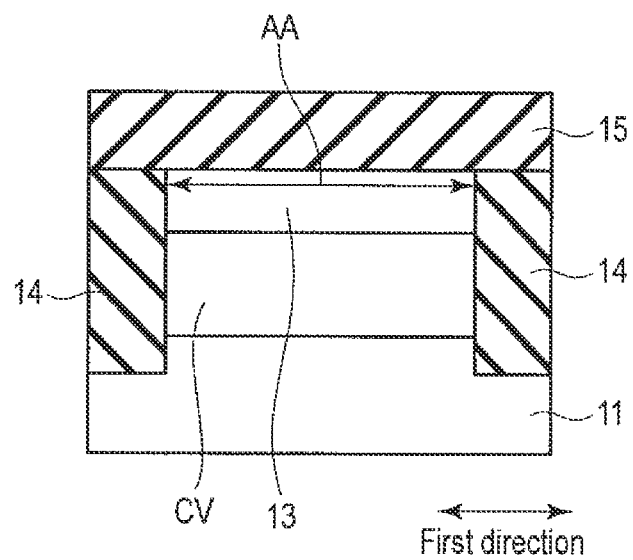
F I G. 12

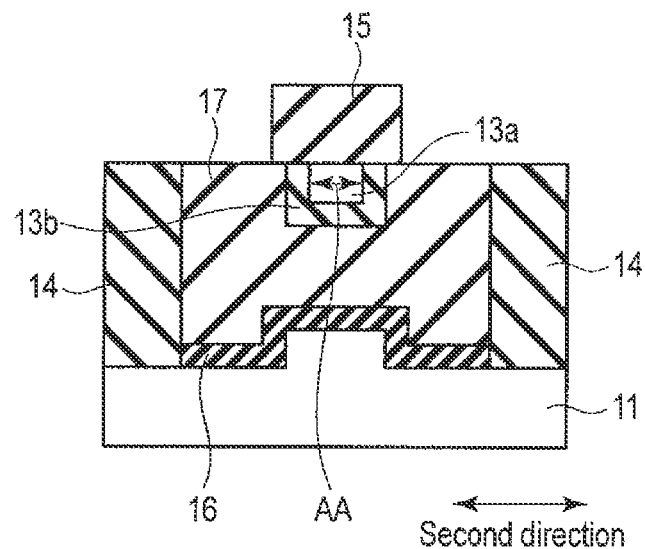
F I G. 17
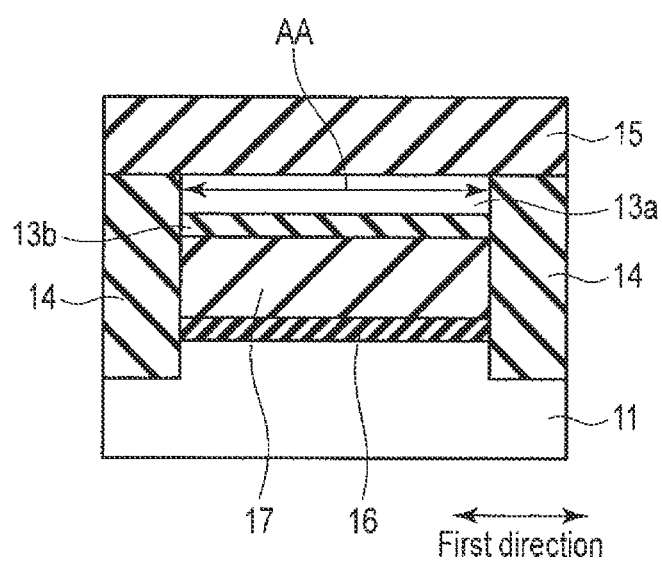
F I G. 18

US 8,871,615 B2

METHOD OF MANUFACTURING SEMICONDUCTOR DEVICE

CROSS-REFERENCE TO RELATED APPLICATIONS

This application is based upon and claims the benefit of priority from Japanese Patent Application No. 2013-061842, filed Mar. 25, 2013, the entire contents of which are incorporated herein by reference.

FIELD

Embodiments described herein relate generally to a method of manufacturing a semiconductor device.

BACKGROUND

In a CMOS circuit, a p-channel FET preferably uses a Ge channel or SiGe channel having a high hole mobility for a high-speed operation. An NMOS preferably uses an Si channel having a high electron mobility.

On the other hand, in the CMOS circuit, the channel is preferably formed on an insulating layer to prevent a short channel effect. For this reason, the p-channel FET uses a GOI (Germanium On Insulator) substrate or an SGOI (Silicon Germanium On Insulator) substrate, and the n-channel FET uses an SOI (Silicon On Insulator) substrate.

However, it is difficult to inexpensively form the Ge channel or SiGe channel suitable for the p-channel FET and the Si channel suitable for the n-channel FET on one substrate.

BRIEF DESCRIPTION OF THE DRAWINGS

FIG. 1 is one example of a perspective view showing a method of manufacturing a semiconductor device;

FIG. 2 is one example of a perspective view showing the method of manufacturing a semiconductor device;

Figure 7:
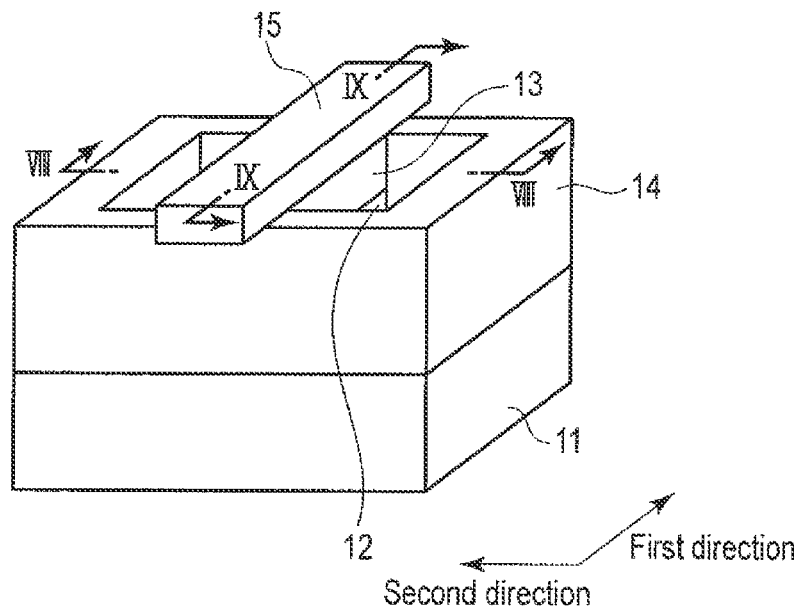
Figure 8:
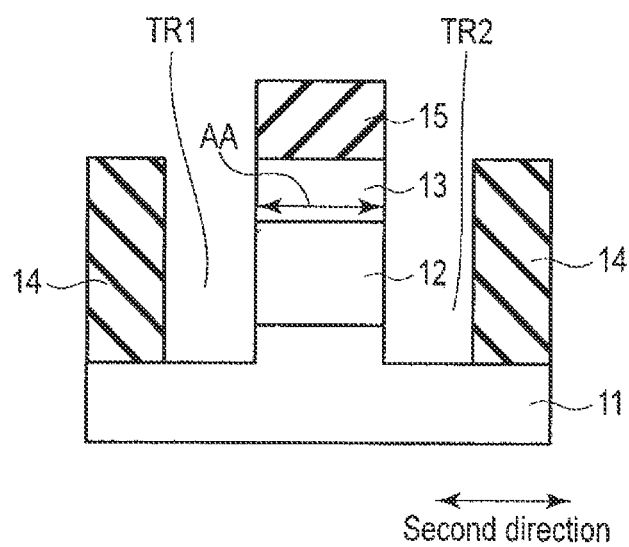
Figure 9:
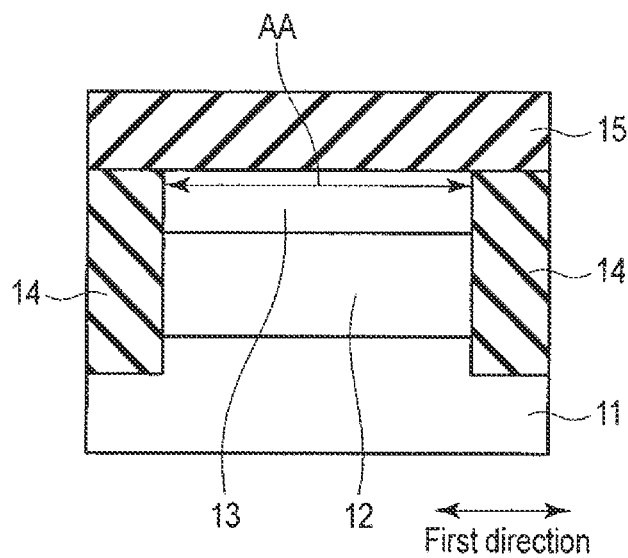
Figure 10:
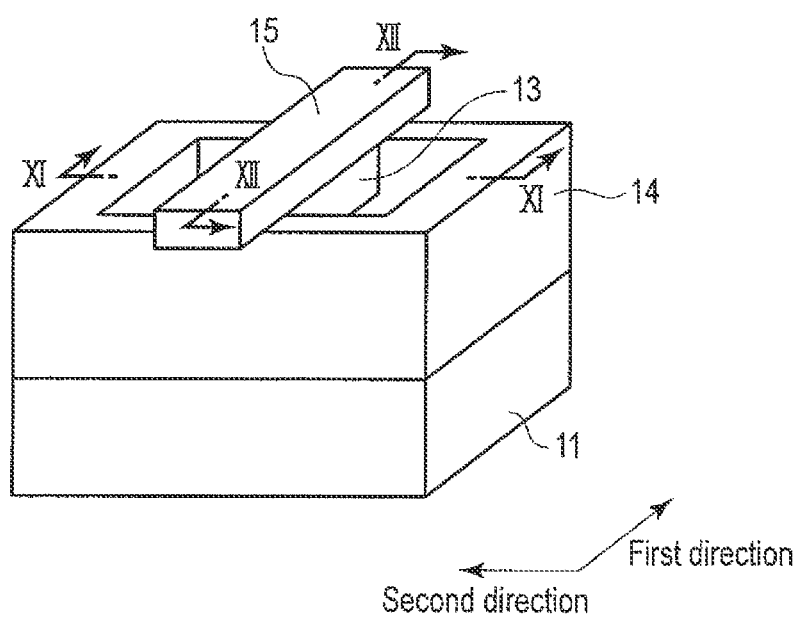
Figure 13:
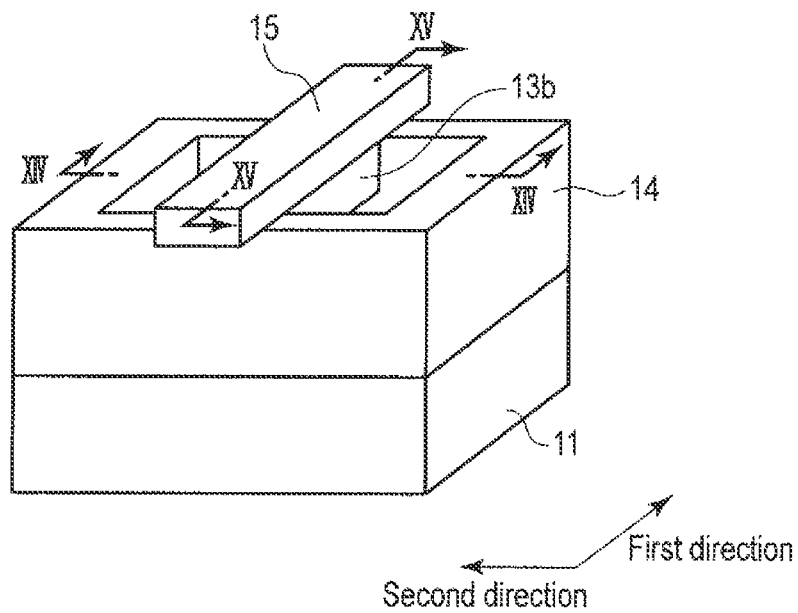
Figure 14:
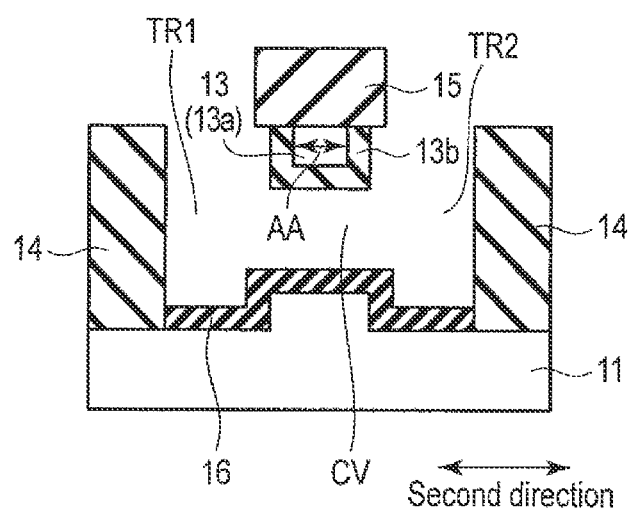
Figure 15:
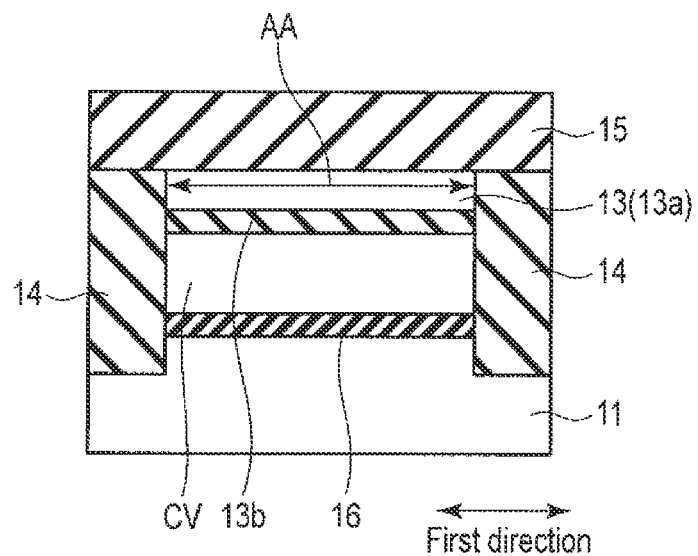
Figure 16:
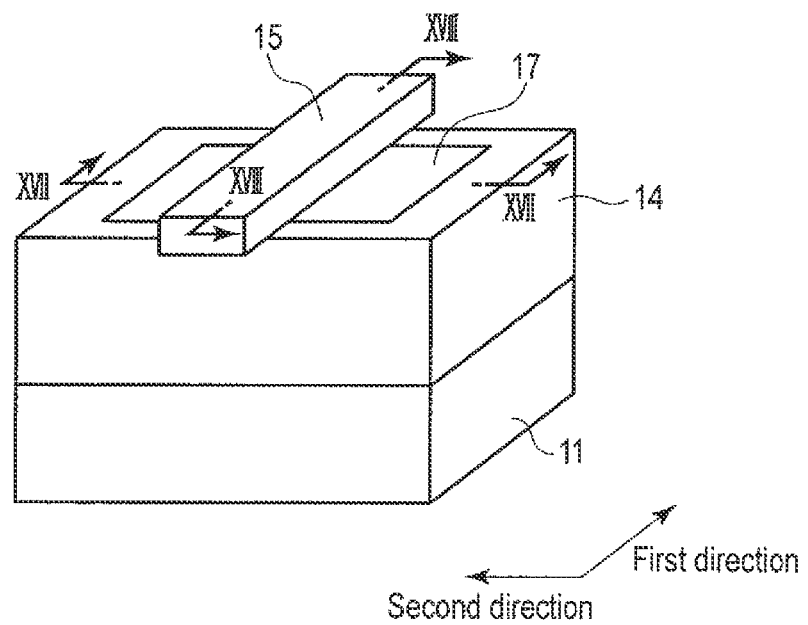
Figure 19:
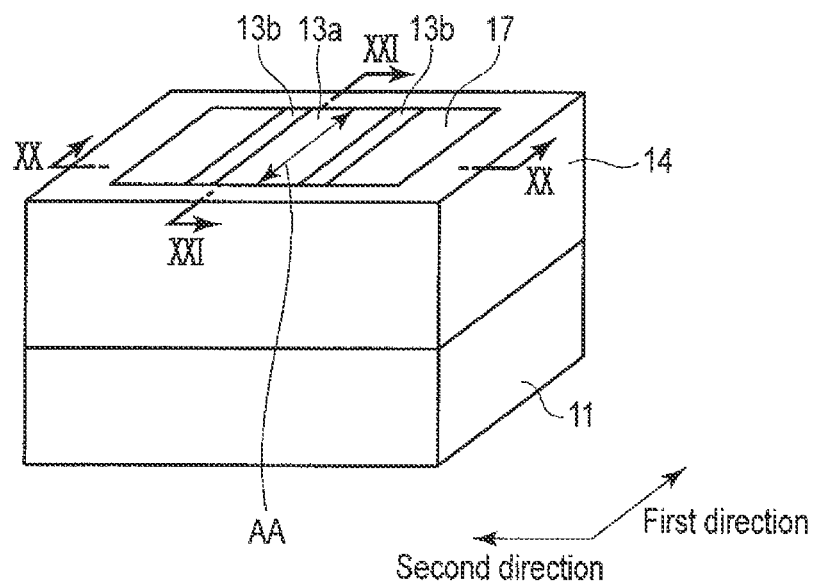
Figure 20:
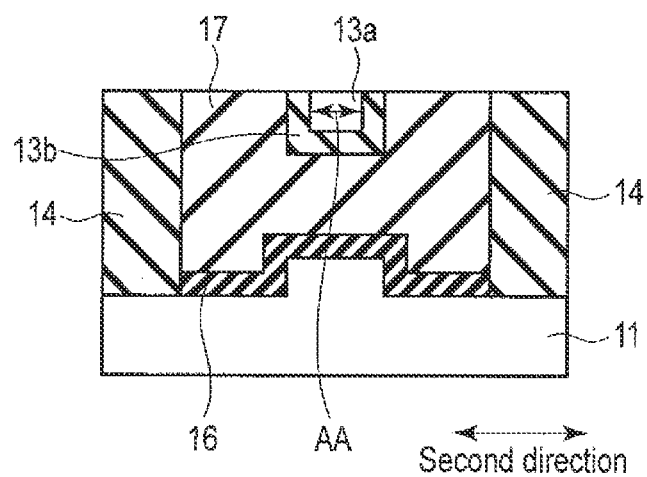
Figure 21:
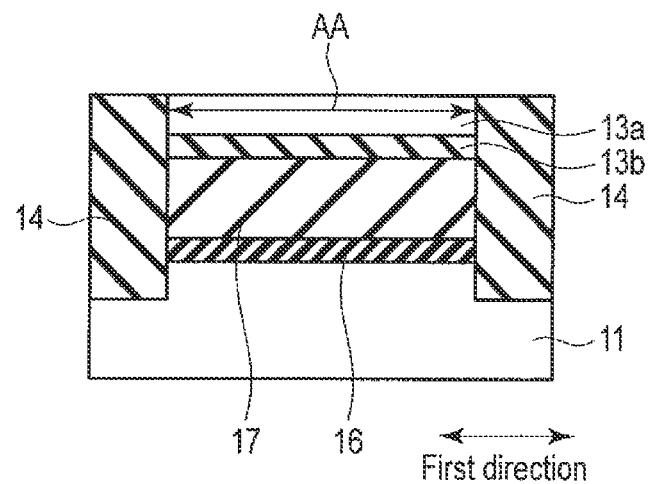
Figure 22:
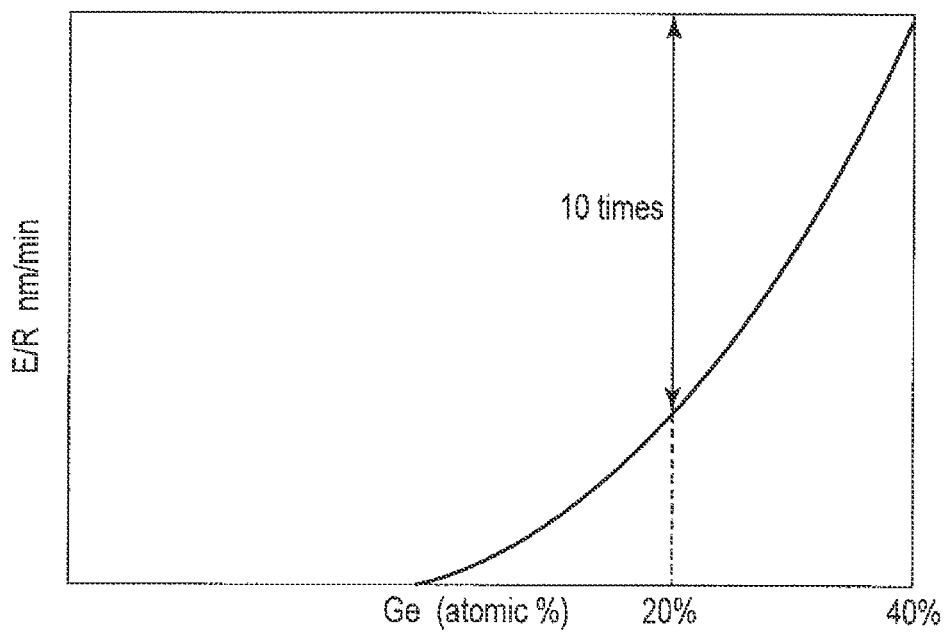
Figure 23:
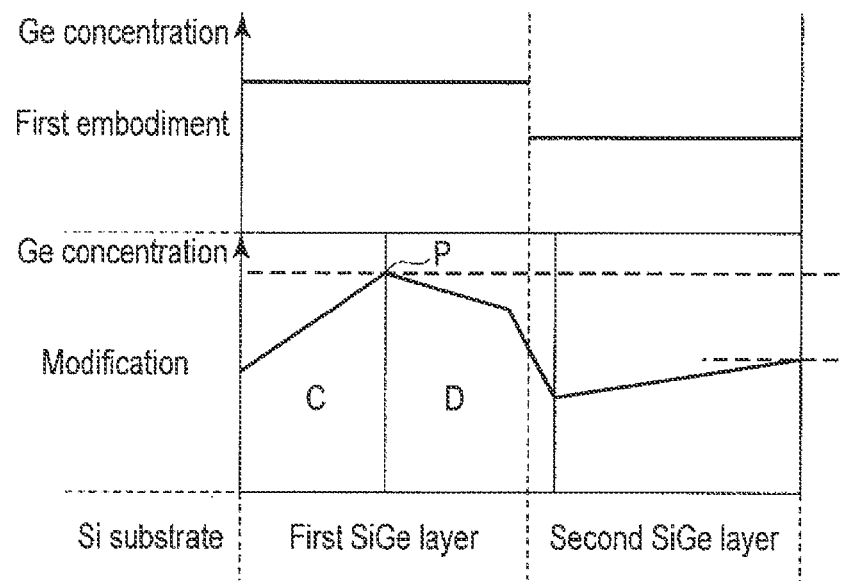
Figure 24:
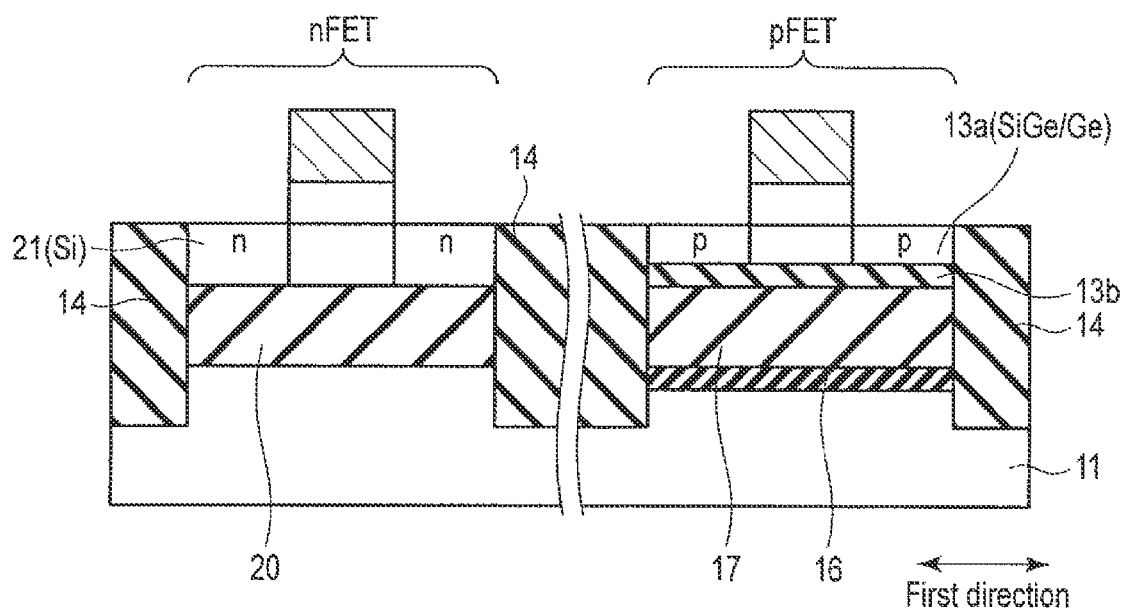

FTC. 7 is one example of a perspective view showing the method of manufacturing a semiconductor device;

FIG. 8 is one example of a sectional view taken along a line VIII-VIII in FIG. 7;

FIG. 9 is one example of a sectional view taken along a line IX-IX in FIG. 7;

FIG. 10 is one example of a perspective view showing the method of manufacturing a semiconductor device;

FIG. 11 is one example of a sectional view taken along a line XI-XI in FIG. 10;

FIG. 12 is one example of a sectional view taken along a line XII-XII in FIG. 10;

FIG. 13 is one example of a perspective view showing the method of manufacturing a semiconductor device;

FIG. 14 is one example of a sectional view taken along a line XIV- XIV in FIG. 13;

FIG. 15 is one example of a sectional view taken along a line XV-XV in FIG. 13;

FIG. 16 is one example of a perspective view showing the method of manufacturing a semiconductor device;

FIG. 17 is one example of a sectional view taken along a line XVII-XVII in FIG. 16;

FIG. 18 is one example of a sectional view taken along a line XVIII-XVIII in FIG. 16;

FIG. 19 is one example of a perspective view showing the method of manufacturing a semiconductor device;

FIG. 20 is one example of a sectional view taken along a line XX-XX in FIG. 19;

FIG. 21 is one example of a sectional view taken along a line XXI-XXI in FIG. 19;

FIG. 22 is one example of a view showing a change in the etching race with respect to a Ge concentration;

FIG. 23 is one example of a view showing a Ge concentration gradient in first and second SiGe layers; and FIG. 24 is one example of a sectional view showing a method of manufacturing a CMOS circuit according to an application example.

DETAILED DESCRIPTION

In general, according to one embodiment, a method of manufacturing a semiconductor device, the method comprising: forming a first SiGe layer having a first profile of a concentration of Ge on a semiconductor substrate; forming a second SiGe layer having a second profile of a concentration of Ge on the first SiGe layer, the second profile lower than a first peak of the first profile; forming a mask layer on the second SiGe layer; etching the first SiGe layer and the second SiGe layer by anisotropic etching using the mask layer as a mask to form trenches; selectively removing the first SiGe layer exposed into the trenches to form a cavity under the second SiGe layer; and oxidizing side and lower surfaces of the second SiGe layer exposed in the trenches and the cavity to increase the concentration of Ge in the second SiGe layer.

An embodiment will now be described with reference to the accompanying drawings.

[Outline]

The following embodiment proposes a manufacturing method capable of selectively forming a Ge/SiGe channel (active area) on one substrate.

For example, a first SiGe layer having a first Ge concentration is formed on a semiconductor substrate. A second SiGe layer having a second Ge concentration lower than the peak of the first Ge concentration is formed on the first SiGe layer. The first and second SiGe layers are etched by anisotropic etching (for example, RIE) using a mask layer as a mask, thereby forming trenches.

After that, only the first SiGe layer exposed into the trenches is selectively removed using the etching rate difference between the first SiGe layer and the second SiGe layer, thereby forming a cavity under the second SiGe layer.

The side and lower surfaces of the second SiGe layer exposed into the trenches and the cavity are oxidized to raise the second Ge concentration of the second SiGe layer (Ge enriched oxidation). This makes it possible to selectively form a Ge/SiGe channel on one substrate.

Note that if Si in the second SiGe layer is wholly consumed by the Ge enriched oxidation, the second SiGe layer changes to a Ge layer. That is, which one of the SiGe channel and the Ge channel is to be formed on one substrate can be controlled by the degree of Ge enriched oxidation.

Before selectively removing the first SiGe layer, the first Ge concentration can be either constant or changeable in the first SiGe layer. Similarly, the second Ge concentration can be either constant or changeable in the second SiGe layer. That is, the second Ge concentration of the second SiGe layer need only be lower than the peak of the first Ge concentration of the first SiGe layer.

For example, when the semiconductor substrate is an Si substrate, the first Ge concentration of the first SiGe layer is preferably as low (close to Si) as possible in the interface region between the first SiGe layer and the semiconductor substrate to obtain a satisfactory crystalline state of the first SiGe layer.

In this case, the first Ge concentration of the first SiGe layer in the interface region between the first SiGe layer and the semiconductor substrate may be lower than the second Ge concentration of the second SiGe layer. However, since the etching rate of SiGe rises along with an increase in the Ge concentration, the peak of the first Ge concentration of the first SiGe layer at least needs to be higher than the second Ge concentration of the second SiGe layer. This condition needs to be met at any portion in the second SiGe layer.

Additionally, for example, for manufacturing reasons, before selectively removing the first SiGe layer, the first and second Ge concentrations can continuously or discontinuously change in the first and second SiGe layers, respectively, or include a constant portion.

Note that after the side and lower surfaces of the second SiGe layer are oxidized, the trenches and the cavity may be left alone or filled with an insulating layer (for example, $SiO_2$). The trenches and the cavity are preferable for suppressing the parasitic capacitance of an FET but disadvantageously decreases the physical strength of the FET.

If the physical strength of the FET poses a problem, the trenches and the cavity are preferably filled with an insulating layer.

According to the above-described manufacturing method, it is possible to, for example, inexpensively form a Ge channel or SiGe channel suitable for a p-channel FET and an Si channel suitable for an n-channel FET on one substrate.

For example, when an insulating layer is formed on a semiconductor substrate, an Si layer is formed on the insulating layer, a p-channel FET is formed on a second SiGe layer, and an n-channel FET is formed on the Si layer, a CMOS circuit can be formed by a simple process.

[Embodiment]

FIGS. 1, 2, 3, 4, 5, 6, 7, 8, 9, 10, 11, 12, 13, 14, 15, 16, 17, 18, 19, 20, and 21 show one example of a method of manufacturing a semiconductor device.

First, as shown in FIG. 1, first SiGe layer 12 having a thickness of, for example, 200 nm is formed on semiconductor substrate (for example, Si substrate) 11 by, for example, epitaxial growth. The composition ratio of Si and Ge in first SiGe layer 12 is, for example, Si:Ge=60:40. This is expressed as "Ge concentration is 40%".

Second SiGe layer 13 having a thickness of, for example, 45 nm is formed on first SiGe layer 12 by, for example, epitaxial growth. The composition ratio of Si and Ge in second SiGe layer 13 is, for example, Si:Ge=80:20. This is expressed as "Ge concentration is 20%".

In this example, the composition ratios of Si and Ge in first SiGe layer 12 and second SiGe layer 13 are assumed to be constant. That is, the Ge concentrations in first SiGe layer 12 and second SiGe layer 13 are assumed to be constant.

Next, as shown in FIG. 2, mask layer MK is formed on second SiGe layer 13. Mask layer MK can be a resist layer or a hard mark layer of $SiO_2$, SiN, or the like. After that, first SiGe layer 12 and second SiGe layer 13 are etched by anisotropic etching, for example, RIE using the mask layer MK as a mask, thereby obtaining the structure shown in FIG. 3. After that, mask layer MK is removed.

Figure 3:
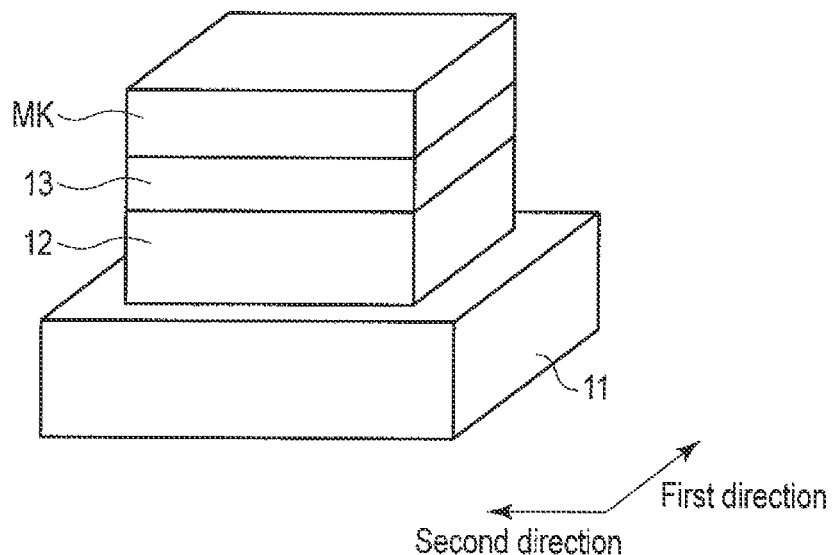
FIG. 3 is one example of a perspective view showing the method of manufacturing a semiconductor device.
Figure 4:
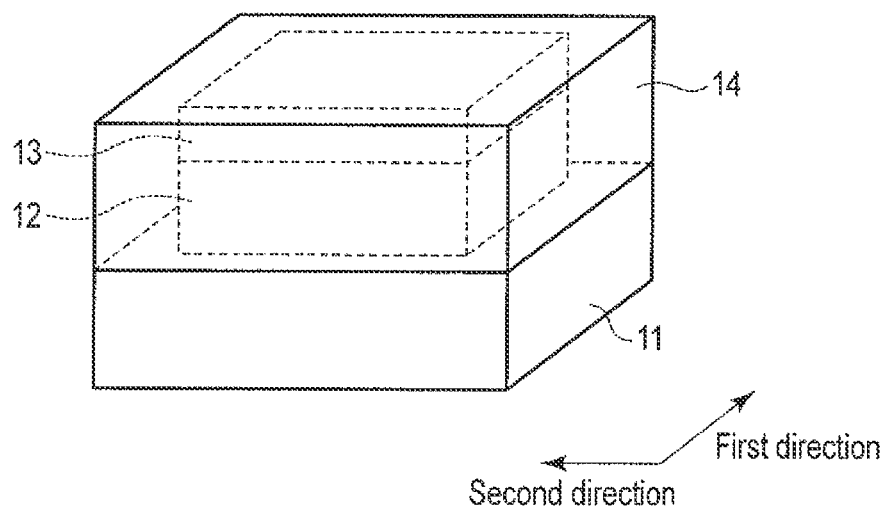
FIG. 4 is one example of a perspective view showing the method of manufacturing a semiconductor device.
Figure 5:
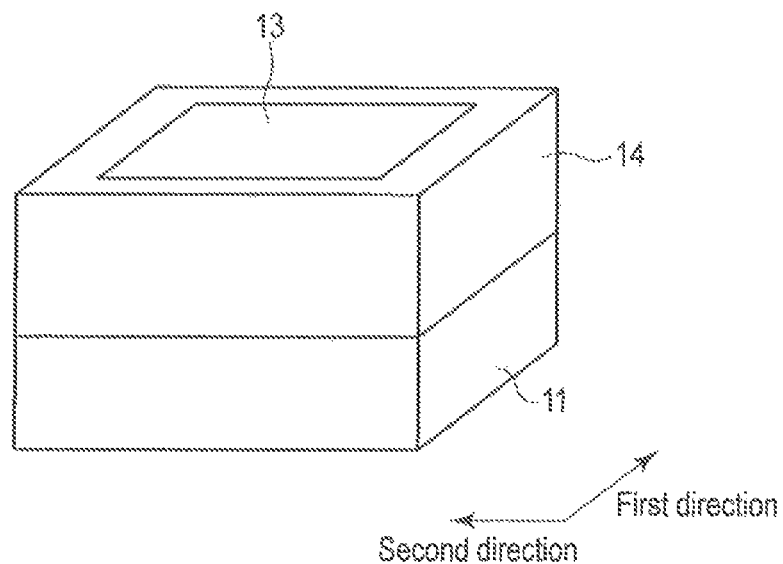
FIG. 5 is one example of a perspective view showing the method of manufacturing a semiconductor device.

As shown in FIG. 4, insulating layer (for example, $SiO_2$) 14 that has a thickness of, for example, 300 nm and completely covers first SiGe layer 12 and second SiGe layer 13 is formed on semiconductor substrate 11 by, for example, LPCVD. As shown in FIG. 5, the upper surface of insulating layer 14 is polished by CMP to expose the upper surface of second SiGe layer 13 from insulating layer 14.

First SiGe layer 12 and second SiGe layer 13 surrounded by insulating layer 14 serving as, for example, support members are thus formed.

Figure 6:
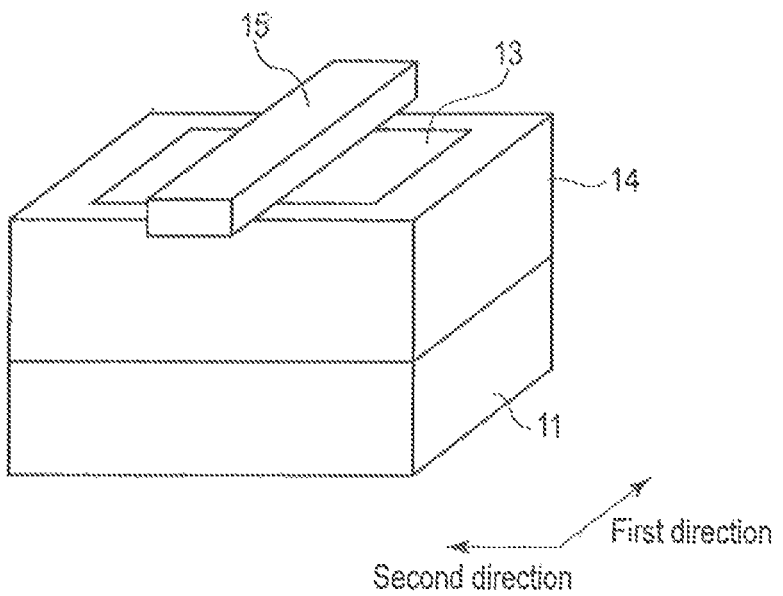
FIG. 6 is one example of a perspective view showing the method of manufacturing a semiconductor device.

Next, and mask layer (insulating layer of $SiO_2$, SiN or the like) 15 is formed on second SiGe layer 13, as shown in FIG. 6, by, for example, LPCVD. Hard mask layer 15 has, for example, a linear shape having a predetermined width in a second direction and extending in a first direction. The overlap portion between second SiGe layer 13 and hard mask layer 15 is an active area.

As shown in FIGS. 7, 8, and 9, first SiGe layer 12 and second SiGe layer 13 are etched by anisotropic etching (for example, RIE). As a result, trenches TR1 and TR2 are formed in a portion surrounded by insulating layer 14 and the first SiGe layer 12 and the second SiGe layer 13, which are covered by hard mask layer 15.

Note that second SiGe layer 13 between two trenches TR1 and TR2 serves as active area AA.

After that, first SiGe layer 12 exposed into trenches TR1 and TR2 is selectively removed, thereby obtaining the structure shown in FIGS. 10, 11, and 12. That is, cavity CV that connects first trench TR1 and second trench TR2 is formed immediately under second SiGe layer 13, as is apparent from FIGS. 10, 11, and 12.

When forming cavity CV, since the Ge concentration (composition ratio of Ge) of first SiGe layer 12 is higher than the Ge concentration (composition ratio of Ge) of second SiGe layer 13, only first SiGe layer 12 can selectively be etched while suppressing etching of second SiGe layer 13.

FIG. 22 shows a change in the etching rate of the SiGe layer.

Referring to FIG. 22, the abscissa represents the Ge concentration (atomic %), and the ordinate represents the etching rate E/R (nm/min).

The etching conditions are, for example, etching gas: $H_2$ and HCl, etching temperature: 600° C. to 700° C., and etching time: 60 min.

As is apparent from FIG. 22, when the Ge concentration in the SiGe layer rises, the etching rate also rises. This indicates that the high Ge concentration in the SiGe layer causes an active reaction between the SiGe layer and the etching gas. For example, when the Ge concentration of first SiGe layer 12 is 40%, and the Ge concentration of second SiGe layer 13 is 20%, as in this example, the etching rate difference is about 10 times.

As described above, only first SiGe layer 12 can selectively be etched using the Ge concentration difference between first SiGe layer 12 and second SiGe layer 13.

Next, as shown in FIGS. 13, 14, and 15, the side and lower surfaces of second SiGe layer 13 (13a) exposed to trenches TR1 and TR2 and the cavity CV are oxidized to form oxide layer 13b on the side and lower surfaces of second SiGe layer 13.

As a result, the Ge concentration of second SiGe layer 13 (13a) can be raised (Ge enriched oxidation).

For example, when second SiGe layer 13 (13a) having a Ge concentration of 20% and a thickness of 40 nm is oxidized by 30 nm (75% of the thickness of 40 nm) in an $O_2$ atmosphere at 950° C., the Ge concentration of second SiGe layer 13 (13a) is increased to 80% to 90%.

With this principle, second SiGe layer 13 (13a) can also be changed to a Ge layer by wholly consuming Si in second SiGe layer 13 (13a).

Note that oxide layer 16 is an oxide layer concomitantly formed on semiconductor substrate (for example, Si substrate) 11 at the time of the above-described Ge enriched oxidation.

As shown in FIGS. 16, 17, and 18, trenches TR1 and TR2 and the cavity CV are filled with insulating layer (for example, $SiO_2$) 17 by, for example, LPCVD. This process may be omitted, as already described.

Finally, when hard mask layer 15 is removed by, for example, wet etching, a semiconductor device having active area (Ge channel or SiGe channel) AA on insulating layer 17 is completed, as shown in FIGS. 19, 20, and 21.

A p-channel FET is formed on active area AA by, for example, a CMOS process.

[Modification]

In the above-described embodiment, the Ge concentrations in first SiGe layer 12 and second SiGe layer 13 may be changed in first SiGe layer 12 and second SiGe layer 13.

For example, the Ge concentrations in first SiGe layer 12 and second SiGe layer 13 may have concentration gradients, as shown in FIG. 23.

In area C from peak P of the Ge concentration in first SiGe layer 12 to the side of semiconductor substrate (for example, Si substrate) 11, to prevent roughness caused by the discontinuity of the crystal structure (degradation in the crystalline state) between semiconductor substrate (Si substrate) 11 and first SiGe layer 12, the Ge concentration of first SiGe layer 12 is preferably as low as possible in the interface region between semiconductor substrate 11 and first SiGe layer 12.

In this case, the Ge concentration of first SiGe layer 12 in the interface region between semiconductor substrate 11 and first SiGe layer 12 may be lower than the Ge concentration of second SiGe layer 13.

For the same reason, in area D from peak P of the Ge concentration in first SiGe layer 12 to the side of second SiGe layer 13, to prevent roughness caused by the discontinuity of the crystal structure (degradation in the crystalline state) between first SiGe layer 12 and second SiGe layer 13, the Ge concentration of first SiGe layer 12 preferably moderately becomes close to the Ge concentration of second SiGe layer 13 in the interface region between first SiGe layer 12 and second SiGe layer 13.

[Application Example]

An application example will be described in which a CMOS circuit is formed using an SGOI substrate or a GOI substrate formed by the above-described manufacturing method.

FIG. 24 shows a CMOS circuit.

A p-channel FET is formed on, for example, SiGe layer (Ge layer) 13a on insulating layer 17 on semiconductor substrate 11. Semiconductor substrate 11, SiGe layer (Ge layer) 13a, and insulating layer 17 correspond to, for example, semiconductor substrate 11, SiGe layer (Ge layer) 13a, and insulating layer 17 shown in FIGS. 19, 20, and 21.

An n-channel FET is formed on Si layer 21 on insulating layer 20 on semiconductor substrate 11. Si layer 21 can be formed either after formation of SiGe layer (Ge layer) 13a or before formation of SiGe layer (Ge layer) 13a.

It is also possible to partially form SiGe layer (Ge layer) 13a in, for example, a SOI substrate using the above-described manufacturing method, and then form an n-channel FET on the Si layer in the SOI substrate and a p-channel FET on SiGe layer (Ge layer) 13a.

CONCLUSION

According to the above-described embodiment, it is possible to selectively form a Ge/SiGe channel on one substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    forming a first SiGe layer having a first profile of a concentration of Ge on a semiconductor substrate;
    forming a second SiGe layer having a second profile of a concentration of Ge on the first SiGe layer, the second profile lower than a first peak of the first profile;
    forming a mask layer on the second SiGe layer;
    etching the first SiGe layer and the second SiGe layer by anisotropic etching using the mask layer as a mask to form trenches;
    selectively removing the first SiGe layer exposed into the trenches to form a cavity under the second SiGe layer; and
    oxidizing side and lower surfaces of the second SiGe layer exposed in the trenches and the cavity to increase the concentration of Ge in the second SiGe layer.

2. The method of claim 1, further comprising
    forming first and second support members in the first and second SiGe layers, respectively, the first and second support members extended in a first direction,
    wherein the mask layer extends in a second direction perpendicular to the first direction to be formed on the first and second support members, and
    the trenches are formed in areas being adjacent to two side walls of the mask layer in the first direction, respectively.

3. The method of claim 2,
    wherein each of the first and second support members has first and second ends in the first direction, respectively,
    the first end of the first support member is connected to the first end of the second support member, and
    the second end of the first support member is connected to the second end of the second support member.

4. The method of claim 1,
    wherein the second SiGe layer functions as an active area.

5. The method of claim 1, further comprising:
    converting the second SiGe layer into a Ge layer by wholly consuming Si in the second SiGe layer at the oxidizing.

6. The method of claim 1, further comprising:
    filling the trenches and the cavity with a first insulating layer, after the side and lower surfaces of the second SiGe layer are oxidized.

7. The method of claim 6, further comprising:
    forming a second insulating layer on the semiconductor substrate,
    forming a Si layer on the second insulating layer, and
    forming a CMOS circuit by forming a p-channel FET on the second SiGe layer and by forming an n-channel FET on the Si layer.

8. The method of claim 1,
wherein the second SiGe layer having the second profile of the concentration of Ge on the first SiGe layer, and
the first profile is varied in the first SiGe layer and the second profile is varied in the second SiGe layer, before selectively removing the first SiGe layer.

9. The method of claim 1,
wherein the second SiGe layer having the second profile of the concentration of Ge on the first SiGe layer, and
the second profile has a second peak in the second SiGe layer, and
the first peak is higher than the second peak.

10. The method of claim 1,
wherein the first peak is located at a center of the first SiGe layer.

11. The method of claim 9,
wherein the second peak is located between an upper portion and a lower portion of the second SiGe layer.

12. The method of claim 9,
wherein the second peak is located in one of an upper portion and a lower portion of the second SiGe layer.

13. The method of claim 1,
wherein the concentration of Ge in the first SiGe layer and the concentration of Ge in the second SiGe layer are equal to one another in an interface between the first and second SiGe layers.

14. The method of claim 1,
wherein the second SiGe layer having the second profile of the concentration of Ge on the first SiGe layer, and
the second profile has a bottom in the second SiGe layer.

15. The method of claim 9,
wherein a bottom of the first profile is equal to or larger than the second peak.

16. The method of claim 1,
wherein a difference between the concentration of Ge in the first SiGe layer and the concentration of Ge in the second SiGe layer is equal to or larger than 20%.

* * * * *